(12) United States Patent
Brune et al.

(10) Patent No.: US 6,956,333 B2
(45) Date of Patent: Oct. 18, 2005

(54) HOT ELECTRON EMISSION ARRAY FOR E-BEAM PHOTOLITHOGRAPHY AND DISPLAY SCREENS

(75) Inventors: Harald Brune, Lausanne (CH); Detlev Gruetzmacher, Lauchringen (DE)

(73) Assignees: Paul Scherrer Institut (PSI), Villigen (CH); Ecole Polytechnique Federale de Lausanne (EPFL), Lausanne (CH)

( * ) Notice: Subject to any disclaimer, the term of this patent is extended or adjusted under 35 U.S.C. 154(b) by 329 days.

(21) Appl. No.: 10/339,119

(22) Filed: Jan. 9, 2003

(65) Prior Publication Data

US 2004/0135518 A1 Jul. 15, 2004

(51) Int. Cl.$^7$ ................................................ G09G 3/10
(52) U.S. Cl. .............................. 315/169.3; 315/169.1; 313/584
(58) Field of Search ..................... 315/169.1, 169.2, 315/169.3, 169.4; 313/495, 584, 587; G09G 3/10

(56) References Cited

U.S. PATENT DOCUMENTS

| | | | |
|---|---|---|---|
| 4,601,971 A | | 7/1986 | Lischke |
| 6,066,922 A | * | 5/2000 | Iwasaki et al. .......... 315/169.3 |
| 6,114,715 A | * | 9/2000 | Hamada ...................... 257/72 |
| 6,281,510 B1 | * | 8/2001 | Yoshitake et al. ....... 250/492.2 |
| 6,339,293 B1 | * | 1/2002 | Kimiya et al. ................ 315/15 |

FOREIGN PATENT DOCUMENTS

| | | |
|---|---|---|
| DE | 3432877 | 3/1986 |
| DE | 3741124 | 6/1989 |
| EP | 0797233 | 9/1997 |
| JP | 10214043 | 8/1998 |

OTHER PUBLICATIONS

Copy—3 sheets from the Applied Physics Letters—vol. 73, No. 19, dated Nov. 9, 1998—enttitled "Hot electron emission lithography"—pp. 2835–2837.

* cited by examiner

Primary Examiner—Trinh Vo Dinh
(74) Attorney, Agent, or Firm—Sturm & Fix LLP

(57) ABSTRACT

This invention relates to a device for emitting addressable locations comprises parallel spaced-apart first conductors (10) intersecting with parallel spaced-apart second conductors (11). The intersecting first and second conductors define addressable locations where electrons (12) are emitted in response to the application of an energizing voltage. One face of the first conductors is covered with an insulating layer (13) against which the second conductors (11) are applied, this insulating layer (13) forming a tunnel barrier for hot electrons (12) that travel ballistically through and are emitted from the second conductors (11) in response to the application of the energizing voltage. The emitted electrons impinge a target (30, 40, 50) which can be a light-emitting screen of a flat panel display, such as an electroluminescent polymer of a flat panel screen, or an electroluminescent phosphorous screen, or a target wafer bombarded by the electrons emitted from a flexible e-beam lithography mask. The intersecting conductors (10, 11) can be Al wires, or can be produced by C-MOS technology.

6 Claims, 2 Drawing Sheets

HOT ELECTRON EMISSION ARRAY FOR E-BEAM PHOTOLITHOGRAPHY AND DISPLAY SCREENS

FIELD OF THE INVENTION

This invention relates to a device for emitting electrons at addressable locations. The device is conceived as backside electrode of a flat panel screen for the effective injection of ballistic electrons into an organic light emitting layer or for the emission of such electrons and their subsequent acceleration towards a luminescent phosphorous screen. The device may also be used as an addressable electron source in e-beam lithography.

BACKGROUND OF THE INVENTION

One of the fundamental problems in the realization of an organic light-emitting diode (OLED) flat panel screen is the transport of charge carriers from the backside electrode into the organic layer being hampered by the Schottky barrier at the interface. Field emission display devices, based on Fowler-Nordheim electron emission from point sources such as carbon nanotubes, face the problem of homogeneous emission currents. Both device types, as well as the currently available thin film technology (TFT) liquid crystal displays, suffer from the need of a large number of transistors used to address their pixels, namely at least one transistor per pixel for black-white displays.

Another fundamental problem in the realization of polymer LED based flat panel screens is the addressed injection of charge carriers.

U.S. Pat. No. 4,601,971 of B. Lischke proposed to make use of the basic principle of tunnel cathodes as electron sources for e-beam lithography masks. These known e-beam masks are produced by structuring a master wafer with e-beam lithography such that the master provides a static pattern of electrons which can be projected onto many target wafers reducing costs in e-beam lithography. Such an e-beam mask was realized recently in semiconductor-insulator-metal (SIM) technology, see R. Tromp et al. Appl. Phys. Lett. 73, 2835 (1998). The principle relies on tunnel cold-cathodes, where electrons tunnel through an oxide layer separating two electrodes. The positive electrode is thin compared to the mean free path of electrons in the electrode material such that the tunnel electrons travel ballistically through this electrode. If the kinetic energy, given by the applied tunnel voltage, is larger than the work function of the electrode material ballistic electrons are emitted into vacuum. These known e-beam lithography masks however suffer from the limitation that they are "static".

SUMMARY OF THE INVENTION

An object of the present invention is to provide a pixel array of hot electron emitters, advantageously based on a suitably nanostructured semiconductor-insulator-metal (SIM) or metal-insulator-metal (MIM) tunneling device, that can serve as source for the addressable injection of electrons to a target.

The new idea is to provide a pixel array which leads to a dynamic mask to write arbitrary patterns into an e-beam resist with many electron emitters working in parallel. Besides lithography, the most promising application of the pixel array will be as emitter for flat panel displays through electron injection into polymers. Electron acceleration onto a conventional phosphorous screen is also possible.

According to the invention, a device for emitting electrons at addressable locations comprises parallel spaced-apart first conductors intersecting with parallel spaced-apart second conductors. The intersecting first and second conductors define the addressable locations where electrons are emitted in response to the application of an energizing voltage. One face of the first conductors is covered, at least at the intersections of the first and second conductors, with an insulating layer against which the second conductors are applied, this insulating layer forming a tunnel barrier for hot electrons that travel balistically through and are emitted from the second conductors in response to the application of the energizing voltage.

The proposed device achieves considerable improvement with respect to all aforementioned problems, i.e. it enables efficient electron injection, a homogeneous current density and easy addressability.

The main advantages of this hot electron emission array over conventional metal electrodes are low power consumption through ballistic electron injection/emission and the built-in easy addressability. The selected pixel emits electrons with a kinetic energy given by the tunnel voltage. The current density can be adjusted for a given tunnel voltage by the oxide thickness. (typically 2–7 nm). Pixels are addressed by addressing their lines and columns which reduces the number of transistors needed to n+m for a display with n×m resolution.

In contrast to known static tunnel cathode masks for e-beam lithography proposed by Lischke and by Tromp (see above), our invention is an array of easy addressable tunnel cathodes generating hot electrons at the selected pixels, also for application in flat panel display technology.

For specific applications, the device may further comprise a target spaced apart from the second conductors and against which the emitted electrons impinge, as well as means for applying the energizing voltage selectively between the first and second conductors, and means for applying an electron accelerating or injection voltage between the second conductors and the target.

In one embodiment, the target is a light-emitting screen of a flat panel display, for example a light-emitting screen consisting of an electroluminescent polymer and of a transparent counter electrode; or the light-emitting screen is a phosphorous screen.

The combination of a pixel array of individually controlled small hot electron emitters with organic polymer LED technology opens up new paths for the realization of flat panel displays which will impact the growing market of flat panel screens. High spatial pixel densities are straightforwardly realized. A conservative estimate is 100 pixel/mm. The high-resolution end of flat displays is becoming economically important whereas current LCD-technology is not able to display the new standard of professional CCD-cameras reaching photographic resolution (5000 pixel×4000 lines).

For realization of a polymer-based flat panel screen the grid of intersecting wires is covered by an OLED-layer into which the tunnel electrons are effectively injected at the desired pixel. The holes are provided from an unstructured transparent electrode for instance ITO (indium tin oxide) covering the OLED layer from the top. The electrons emitted from the selected pixel of the hot electron emission array can equally be accelerated through vacuum onto a phosphorous screen. The hot electron emission array can be realized either in standard C-MOS technology as semiconductor-insulator-metal (SIM) tunneling device, or as a low cost metal-insulator-metal (MIM) tunneling device.

Depending on the application in mind the pitch size (i.e. the spacing between the parallel conductors) can be varied from 100 μm for screens of large-scale displays to 10 μm for high-resolution compact displays (digital cameras and other portable applications) and finally down to below 1 μm for an addressable e-beam lithography mask.

In the latter application, where the target is a wafer of a flexible e-beam lithography mask, the demand for smaller and faster devices in mainstream Si electronics has led to an intensive search for lithography processes able to fabricate billions of devices with design rules requiring structures of less than 100 nm. The device according to the invention provides a flexible mask for parallel e-beam writing with possible pixel sizes of less than 100 nm diameter enabling a high resolution, high throughput e-beam lithography process. This device is a low-cost, fast and reasonably easy to fabricate alternative to lithography methods currently used or under development, like standard e-beam, X-ray, AFM or focused ion beam lithography.

Hot electron emission lithography has been used already for static wafer-to-wafer exposure with feature sizes down to 160 nm (R. Tromp; see above). However, the present invention provides a higher flexibility of such a lithography approach and thus has commercial potential in mainstream Si technology.

Whatever the application, the electron emitting device can be made of first conductors formed by a first series of parallel wires and second conductors formed by a second series of parallel wires intersecting with the first series of wires. Typically, such wires are made of aluminum or other suitable metal and can be produced by evaporation techniques, as explained in detail below.

Alternatively, the device can be made using C-MOS technology, in which case the first conductors are parallel p-doped lines in a silicon wafer, the insulating layer is formed of parallel thin oxide strips on the silicon wafer intersecting with the p-doped lines, and the second conductors are parallel metal strips applied over the thin oxide strips, as explained in detail below.

The electron emitting device of the invention can also be used for very small displays as in mobile devices, and for other applications in addition to those mentioned above. Based on the observation that in some photochemical applications, photons are only needed as they create hot electrons in the metal substrate which then trigger a photochemical reaction, the hot electrons produced by the tunnel device according to the invention can directly be used to drive photochemical reactions in molecules adsorbed on top of the metal electrode. An advantage of photochemistry without photons is the tunability of electron energy. This permits electron injection in organic molecules with control over the kinetic electron energy and the lateral position of the injection. Further, the electron emission current in the device according to the invention depends exponentially on the oxide thickness. Thus, a SIM-device covered by a polymer can be used to identify small thickness variations and defects in the ultrathin oxide, simply by lateral variations in luminosity.

BRIEF DESCRIPTION OF THE DRAWINGS

In the accompanying schematic drawings, given by way of example.

DETAILED DESCRIPTION

Figure 1:
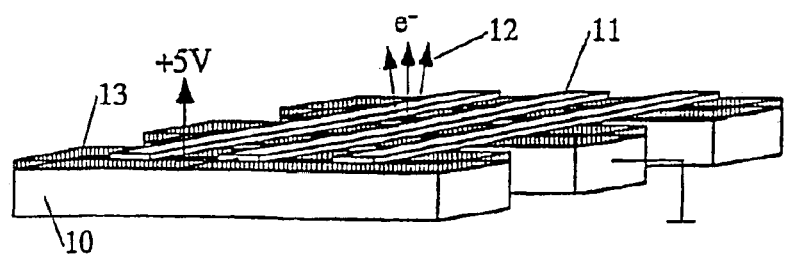
FIG. 1 is a perspective view of a first embodiment of a device according to the invention illustrating the principle of an addressable tunnel cathode.

As shown in FIG. 1, an electron emitting device comprises parallel spaced-apart first conductors 10 intersecting with parallel spaced-apart second conductors 11, the intersecting first and second conductors 10,11 forming electrodes and defining at their intersections addressable locations where electrons 12 are emitted in response to the application of an energizing voltage V, for example 5 V. The top face of the first conductors 10 is covered with an insulating layer 13 against which the second conductors 11 apply. This insulating layer 13 forms the tunnel barrier for hot electrons that travel ballistically through and are emitted at 12 from the second conductors 11 in response to the application of the energizing voltage V.

In this example, the device is advantageously made using Al for both electrodes 10,11. The parallel Al wires 10 are produced by evaporating Al onto an insulating substrate (not shown) and then covered by a homogeneous $Al_2O_3$ layer 13 as oxide barrier, by suitable heat treatment in an oxidizing atmosphere. These 10 wires are then crossed by a second set of parallel relatively thin Al wires 12, for example 2–4 nm thick, laying over the oxide layer 13.

The wires 10 can have any convenient thickness. The pitch or spacing of the parallel wires 10 and 11 is selected according to the application between about 1 μm and 100 μm. The respective widths of these wires 10,11 is scaled accordingly to provide the desired pixel size at their intersections.

Figure 2:
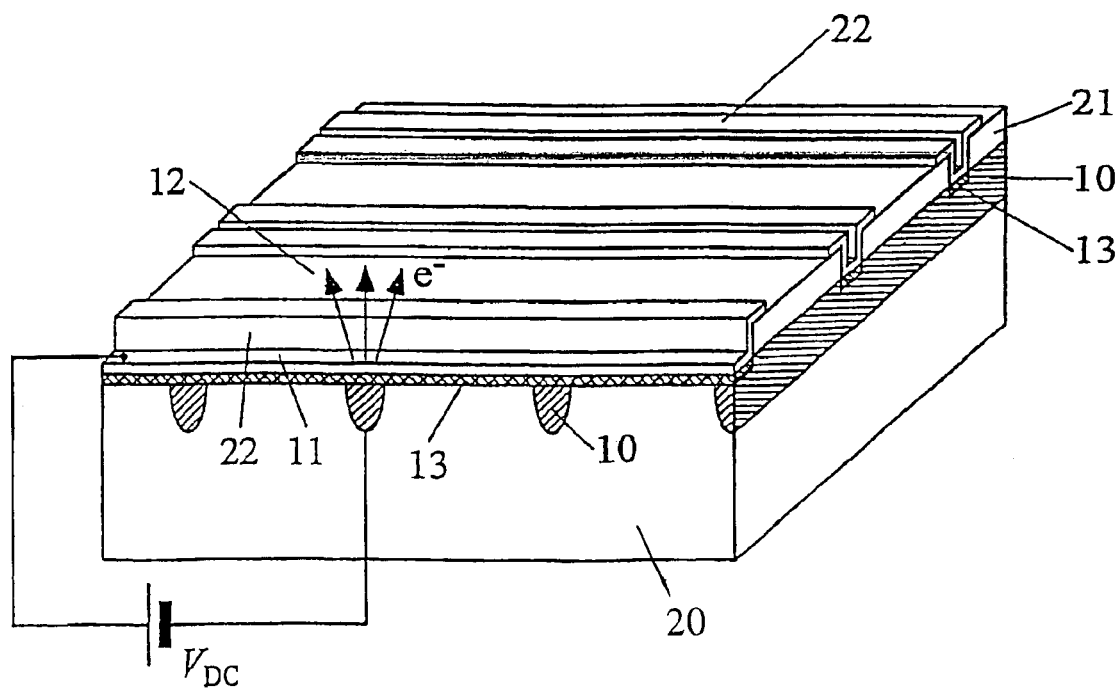
FIG. 2 is a perspective view of a second embodiment of a device according to the invention made using standard C-MOS technology.

The device can also be produced using mainstream C-MOS technology as illustrated with reference to FIG. 2. A Si(100) wafer 20 is heavily doped in a stripe pattern to form a series of parallel p-doped lines forming the first set of conductors 10. On top of the wafer 20 is then grown a film 21 of thermal $SiO_2$ having a thickness of 20 nm or more. This oxide film 21 is then structured to yield a pattern of parallel stripes, at 90° to the conductors 10, by entirely removing the oxide of film 21 along parallel lines at the indicated locations where stripes 13 are to be formed.

The wafer 20 is then overgrown with a 2–7 nm thin thermal oxide 21 yielding stripes 13 with 2–7 nm thick oxide separated by the more than 20 nm thick oxide film 21. The pattern of the oxide stripes 13 is thus at 90° to the underlying dopant pattern of the p-doped lines 10. The thin oxide stripes 13 are subsequently covered by channel-like metal stripes 22. This is achieved by depositing photoresist on the thick oxide areas 21 in-between the stripes 13, then covering the whole wafer with metal which is subsequently removed by a lift off process selectively on the areas covered by photoresist, leaving the channel-like metal stripes 22 over the oxide stripes 13, as shown.

In the case of Al as electrode material the attenuation length for electrons in bulk Al is of the order of 2 nm, thus with 2–4 nm thick electrodes (part 11 of metal stripes 22) electron transmission by ballistic transport through the metal 11 is possible. Al is well suited as electrode material as it develops, when exposed to pure oxygen, a self-limiting oxide layer of only a few atomic layers which is stable in air. The transistors for addressing the pixels are located on the Si(100) wafer at the edge of each line/column formed by the intersecting first and second conductors 10,11. The electron tunneling probability decreases exponentially with oxide thickness. Thus electrons tunnel well-localized through the thin oxide patch addressed, whereas the tunnel current is by orders of magnitude smaller on thick oxide areas of film 21 partly covered by the upper edges of the channel-shaped electrodes 22. Electrons tunneling through the oxide 13 of a pixel addressed by a voltage of about 5 V travel through the metal electrode 11 where they can further be accelerated onto a phosphorous screen or simply be injected into a polymer film or other luminescent material, as described below.

Figure 3:
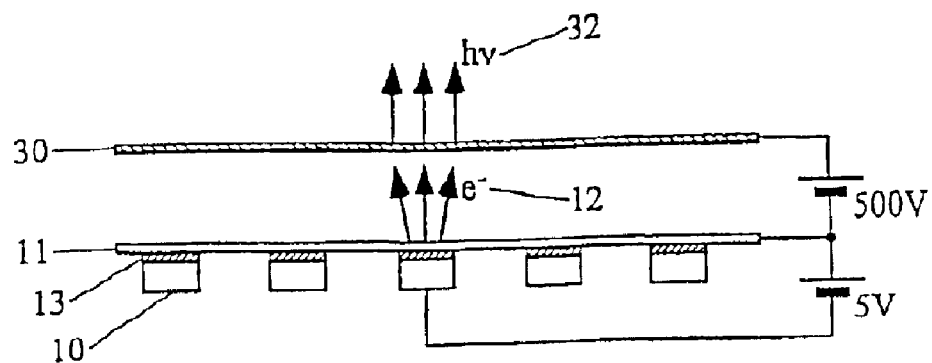
FIG. 3 is a cross-sectional view of a device associated with a phosphorous screen.

FIG. 3 shows an electron emitting device according to the invention device associated with a luminescent phosphorous screen 30. The device comprises intersecting parallel first conductors 10 and second conductors 11 separated at their intersections by the oxide insulating layer 13 forming a tunnel barrier. Electrons 12 are emitted selectively at the intersections by an applied energizing voltage, for example 5V.

The phosphorous screen 30 is spaced apart from the electron-emitting face of the device, the gap therebetween being maintained under vacuum. An accelerating voltage, for example 500 V, is applied across the conductors 11 and screen 22, to accelerate the emitted electrons 12 to the screen 30 where they release photons 32 at pixels corresponding to the intersections of conductors 10,11 where the energizing voltage is selectively applied, thus forming a selectively addressable flat panel display.

Figure 4:
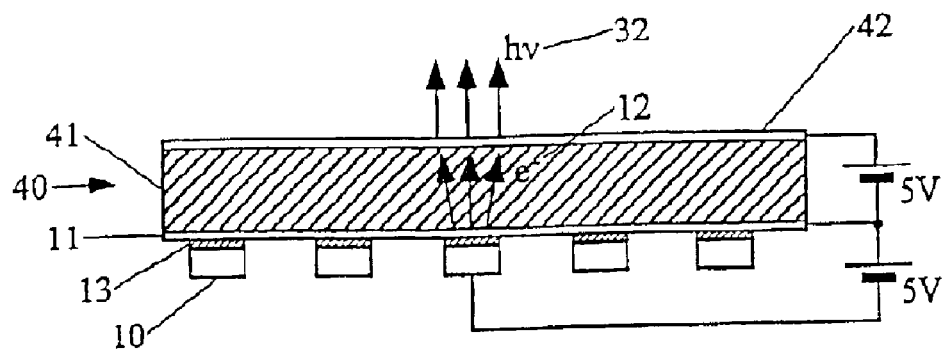
FIG. 4 is a cross-sectional view of a device associated with a polymer flat panel screen.

FIG. 4 shows a device associated with a polymer flat panel screen 40 made up of a layer of electroluminescent polymer 41 such as polyphenyline vinyline (PPV) covered with a transparent ITO (indium tin oxide) electrode layer 42. Here, the electroluminescent polymer 41 is applied directly against the electron-emitting side of the device, against the conductors 11. An injection voltage, for example 5 V, is applied across the conductors 11 and ITO layer 42, to inject the emitted electrons 12 through the polymer 41 to the ITO 42 where they release photons 32. As before, light is emitted at pixels corresponding to the intersections of conductors 10,11 where the energizing voltage is selectively applied, forming a selectively addressable flat panel display.

Figure 5:
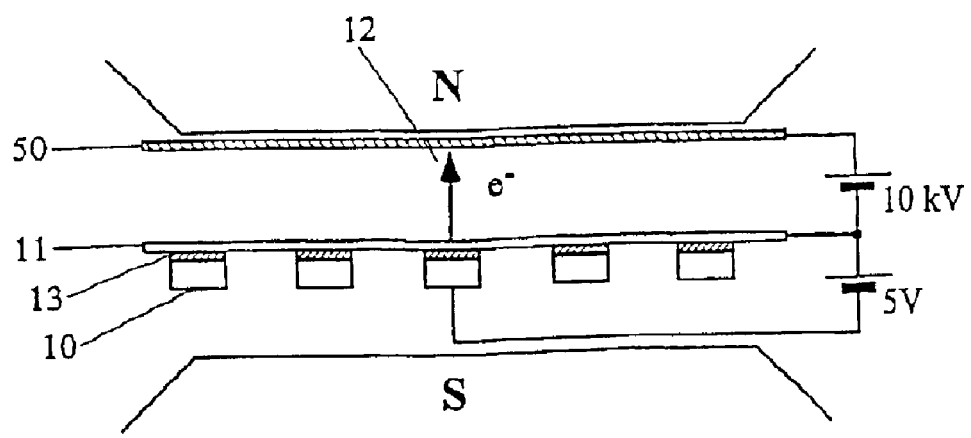
FIG. 5 is a cross-sectional view of a device constituting a flexible mask for e-beam lithography.

FIG. 5 shows a device constituting a flexible mask for e-beam lithography. Here the target is a wafer 50 of a mask for e-beam lithography, for example a semiconducting wafer coated with e-beam resist. The device 10,11,13 forms an electron emission array as source wafer. Electrons 32 emitted from the conductors 11 are subjected to an applied voltage, say 10 kV, across the conductor 11 and wafer 50, and impinge against the target wafer 50 under control of an applied magnetic field. The emitted electrons 32 impact the mask 50 at pixels corresponding to the intersections of conductors 10,11 where the energizing voltage is selectively applied, thus forming a selectively addressable e-beam lithography mask.

Modifications of the described examples and applications are contemplated within the scope of the claims.

What is claimed is:

1. An electron emitting device for emitting electrons at addressable locations, the device comprising parallel spaced-apart first conductors intersecting with parallel spaced-apart second conductors, the intersecting first and second conductors defining addressable locations where electrons are emitted in response to an application of an energizing voltage, one face of the first conductors being covered, at least at the intersections of the first and second conductors, with an insulating layer against which the second conductors are applied, said insulating layer forming a tunnel barrier for hot electrons that travel ballistically through and are emitted from the second conductors in response to the application of said energizing voltage, and wherein the first conductors are parallel p-doped lines in a silicon wafer, the insulating layer is formed of parallel thin oxide strips on the silicon wafer intersecting with said p-doped lines, and the second conductors are parallel metal strips applied over the thin oxide strips.

2. The device of claim 1, further comprising a target spaced apart from the second conductors, means for applying said energizing voltage selectively between the first and second conductors, and means for applying an electron-accelerating voltage between the second conductors and the target.

3. The device of claim 2, wherein the target is a light-emitting screen of a flat panel display.

4. The device of claim 3, wherein the light-emitting screen is composed of an electroluminescent polymer and a transparent counter electrode.

5. The device of claim 3, wherein the light-emitting screen is a phosphorous screen.

6. The device of claim 2, wherein the target is a wafer of a flexible e-beam lithography mask.

* * * * *